United States Patent [19]

Om et al.

[11] Patent Number: 5,200,354

[45] Date of Patent: Apr. 6, 1993

[54] METHOD FOR MANUFACTURING DYNAMIC RANDOM ACCESS MEMORY CELL

[75] Inventors: Jae C. Om, Taegu; In S. Chung, Kyungki, both of Rep. of Korea

[73] Assignee: Hyundai Electronics Industries Co. Ltd., Seoul, Rep. of Korea

[21] Appl. No.: 621,872

[22] Filed: Dec. 4, 1990

Related U.S. Application Data

[62] Division of Ser. No. 381,289, Jul. 18, 1989, abandoned.

[30] Foreign Application Priority Data

Jul. 22, 1988 [KR] Rep. of Korea ............... 88-9189
Sep. 22, 1988 [KR] Rep. of Korea ............. 88-12240

[51] Int. Cl.$^5$ ............................................. H01L 21/70
[52] U.S. Cl. ................................. 437/52; 437/47; 437/48; 437/60; 437/162; 437/203; 437/235; 437/919
[58] Field of Search ............... 437/47, 38, 48, 51, 437/52, 60, 162, 191, 193, 203, 228, 235, 919; 357/23.6, 51

[56] References Cited

U.S. PATENT DOCUMENTS

| | | |
|---|---|---|
| 3,887,993 | 7/1975 | Okada et al. ............... 437/41 |
| 4,356,623 | 11/1982 | Hunter ....................... 437/44 |
| 4,366,613 | 1/1983 | Ogura et al. ............... 437/48 |
| 4,433,468 | 2/1984 | Kawamata .................. 437/193 |
| 4,649,625 | 3/1987 | Lu ............................. 437/52 |
| 4,688,063 | 8/1987 | Lu et al. .................... 357/23.6 |
| 4,728,623 | 3/1988 | Lu et al. .................... 437/52 |
| 4,761,385 | 8/1988 | Pfiester ...................... 437/52 |
| 4,788,160 | 11/1988 | Havemann et al. ....... 437/200 |
| 4,792,834 | 12/1988 | Uchida ...................... 357/23.6 |
| 4,808,543 | 2/1989 | Parrillo et al. ............. 437/47 |
| 4,810,666 | 3/1989 | Tajii .......................... 437/44 |
| 4,816,423 | 3/1989 | Havemann ................. 437/40 |
| 4,873,205 | 10/1989 | Critchlow et al. ........ 357/23.6 |
| 4,890,145 | 12/1989 | Malhi ........................ 357/23.6 |
| 4,894,696 | 1/1990 | Takeda et al. ............ 357/23.6 |

FOREIGN PATENT DOCUMENTS 0208660 9/1987 Japan .
2199696 7/1988 United Kingdom .

OTHER PUBLICATIONS

Sanchez, "Drain Engineered Hot-Electron-Resistant Device Structures"; a Review Jun. 1989.

Primary Examiner—Tom Thomas
Attorney, Agent, or Firm—Low and Low

[57] ABSTRACT

A dynamic random access memory device having a SDT cell structure and a dynamic random access memory device having a SDTSAC cell structure together with methods for manufacturing each cell structure are disclosed.

3 Claims, 5 Drawing Sheets

METHOD FOR MANUFACTURING DYNAMIC RANDOM ACCESS MEMORY CELL

This is a division of application Ser. No. 07/381,289, filed Jul. 18, 1989, now abandoned.

BACKGROUND OF THE INVENTION

1. Field of Invention

This invention relates to a DRAM (Dynamic Random Access Memory) cell of highly integrated semiconductor storage device, and to a method for manufacturing the same, and more particularly to a DRAM cell comprising a SDT (Side-wall Doped Trench capacitor) cell having a trench capacitor cell structure with a high concentration of selectively doped region on a silicon substrate, and a SDTSAC (Side-wall Doped Trench Capacitor using a Self-Aligned Contact) cell in the SDT cell structure for increasing the capacitance of the trench capacitor, and a method for manufacturing such cells.

2. Related Application

Photoresist etch back technology is fully described in a copending patent application, concurrently filed herewith, entitled: A Method For Manufacturing A Trench Capacitor Using A Photoresist Etch Back Process, by Yong Hyeock Yoon and Cheol Kyu Bok, inventors, assigned to Hyundai Electronics Industries Co., LTD., having U.S. Ser. No. 07/381,288, filed Jul. 18, 1989, now U.S. Pat. No. 4,994,409 granted Feb. 19, 1991, said application being expressly incorporated herein by reference as if fully set forth hereat.

INFORMATION DISCLOSURE STATEMENT

In the prior art, since the capacitor region in DRAM devices has been formed in a planar cell structure, the size of the cell increased so that it was not possible to manufacture an effective DRAM. Accordingly, in order to solve this problem, the trench capacitor or laminated capacitor cell structures have been developed in which the structure of the capacitor has three dimensions, such as the following capacitors: CCC structure (Corrugated-trench Capacitor Cell), BSE structure (Buried Storage Electrode Trench) or SPT structure (Substrate Plate Trench Capacitor Cell).

However, first, the cell size in the CCC structure is too big and the concentration of the P well is too high so that the body effect in electrical property of N-MOSFET becomes large.

Second, the BSE structure, which overcomes the disadvantage of the CCC structure set forth above, utilizes a principle of inside charge storage in which doped polysilicon functions as a storage electrode, resulting in a few advantages such as no leak current and reduction of the cell size. But this structure does not comprise C-MOSFET but rather N-MOSFET so that it consumes too much power. Further an epitaxial layer structure should be utilized and due to the buried contact structure, the process for manufacturing the cell is complex.

Third, in the SPT structure, the distance between capacitors is minimized by forming the capacitors under a field oxide film thereby reducing soft error rate caused by α particles near the P-N junction. Also, noise reduction can be obtained. This structure results in an improvement over the BSE structure. However, in this structure, when P type or N type well region is formed at an epitaxial layer on the substrate, an expensive impurity ion implantation apparatus using high voltage must be utilized instead of a high temperature diffusion process and an epitaxial substrate resulting in high manufacturing cost of the cell.

Accordingly, it is an object of the present invention to provide a DRAM cell and a method for manufacturing such. The DRAM of the present invention comprises a SDT cell structure in which charges can be stored in the trench and the effective capacitance can be increased by forming a P+diffusion region selectively on the wall of the trench, instead of using an epitaxial layer, in order to avoid the disadvantages set forth above and to reduce the size of the cell.

It is an another object of the present invention to provide a method for manufacturing a DRAM cell and a DRAM cell comprising a SDTSAC structure in which the process for connecting the bit lines and the source electrode of a transfer gate, and the drain electrode and the charge storage electrode in the trench can be implemented by a self-aligned contact process which does not require a contact mask, whereby it is possible to reduce the tolerance i.e. an effective distance required during the contact mask alignment process in the prior art so that the area of the DRAM cell comprising a SDT cell and a MOSFET can be reduced.

BRIEF SUMMARY OF THE INVENTION

The present invention relates to a dynamic random access memory, DRAM, of a SDT cell structure which comprises a P type silicon substrate on which a P well region is formed. A trench is formed through the P well region and extendS into the P type silicon substrate. The trench further includes a wall having an inner surface and an outer surface and a top. A capacitive dielectric thin film layer is formed on the inner surface of the wall of the trench Material for forming a charge storing electrode fills the trench. A field oxide layer is formed on a portion of the top of the trench and on the surface of the P well region located proximate the trench. A gate electrode line is formed on the field oxide layer. A selectively doped P+diffusion region is formed from the outer surface of the wall of the trench in a portion of the P well region and a portion of the P type silicon substrate. A N MOSFET is formed on the P well region proximate the trench with the N MOSFET having a gate electrode, a source electrode and a drain electrode, with the source electrode and the drain electrode each including a LDD region. An oxide film spacer is formed at each side of the gate electrode and the gate electrode line. A conducting layer is formed on the gate electrode, gate electrode line, drain electrode and source electrode. A first insulating layer is deposited on the conducting layer except for a portion of the top of the source electrode. A polycide layer for a bit line is formed on the first insulating layer and connected to the conducting layer on the source electrode. A second insulating layer is formed on the polycide layer for the bit line. A protective layer is formed on the second insulating layer for protecting the cell.

The present invention also relates to a method for manufacturing a DRAM of SDT cell structure which comprises forming a P well region on a P type silicon substrate. A trench is formed from the top of the P well region into a portion of the P type substrate with the trench having a wall with an inner surface and an outer surface. A selectively doped P+diffusion region is formed from the outer surface of the wall of the trench into a portion of the P well region and into a portion of the P type silicon substrate. A capacitive dielectric film layer is formed on the inner surface of the wall of the trench. The trench is filled with material for a charge storing electrode, and is planarized to give the top of the trench a smooth top surface. A field oxide layer is formed by LOCOS technology on a portion of the top surface of the trench and on the P well region proximate the trench. A gate electrode is formed by a mask pattern process on a portion of the P well region opposite the field oxide layer and a gate electrode line is formed by the mask pattern process on a portion of the field oxide layer. LDD regions are formed by an ion implantation process in the P well region near both sides of the gate electrode. An oxide film spacer is formed at each side of the gate electrode and at each side of the gate electrode line. A source electrode and a drain electrode are formed in the P well region by the ion implantation process such that a portion of the source and a portion of the drain electrode are located under the gate electrode. A conducting layer is formed on the entire surface except for a portion of the field oxide layer and the oxide film spacers formed at each side of the gate electrode and the gate electrode line, thereby connecting the drain electrode and the charge storing electrode. A first insulating layer is formed on the entire surface after the drain electrode and the source electrode are connected. A portion of the first insulating layer is removed by the mask patterning process, from the conducting layer which is formed over a portion of the source electrode. A polycide layer for a bit line is formed on the first insulating layer and the conducting layer, where a portion of the first insulating layer has been removed, thereby connecting the source electrode to the polycide layer. A second insulating layer and a protective layer on the polycide layer for the bit line are sequentially formed.

The invention also relates to a DRAM of a SDTSAC cell structure which comprises a P type silicon substrate on which a P well region is formed with a trench formed through the P well region and extending into the P type silicon substrate with the trench further including a wall having an inner surface and an outer surface and a top. A capacitive dielectric thin film layer is formed on the inner surface of the wall of the trench. Material for forming a charge storing electrode fills the trench. A field oxide layer is formed on a portion of the top of the trench and on a surface of the P well region located proximate the trench. A gate electrode line is formed on the field oxide layer. A selectively doped P+diffusion region is formed from the outer surface of the wall of the trench in a portion of the P well region and a portion of the P type silicon substrate. A N MOSFET is formed on the P well region proximate the trench with the N MOSFET having a gate electrode and a source electrode and a drain electrode, with the source electrode and the drain electrode each including a LDD region An oxide film spacer is formed at each side of the gate electrode and the gate electrode line. An insulating layer is formed on the gate electrode and gate electrode line. A conducting layer is formed on a portion of the top of the gate electrode, gate electrode line, drain electrode and source electrode, except for the top portion of the field oxide layer and a portion of top of the insulating layer formed on the gate electrode and the gate electrode line. A first insulating layer is deposited on the conducting layer except for a portion of the top of the conducting layer formed on the source electrode. A polycide layer for a bit line is formed on the insulating layer and is connected to the conducting layer on the source electrode. A second insulating layer is formed on the polycide layer for the bit line. A metal layer and a protective layer are the formed on the second insulating layer.

This invention further relates to a method for manufacturing a DRAM of SDTSAC cell structure which comprises forming a P well region on a P type silicon substrate and then forming a trench from the top of the P well region into a portion of the P type substrate with the trench having a wall with an inner surface and an outer surface. A doped P+diffusion region is selectively formed from the outer surface of the wall of the trench in a portion of the P well region and in a portion of the P type silicon substrate. A capacitive dielectric film layer is then formed on the inner surface of the wall of the trench and the trench is then filled with material for a charge storing electrode. The top of the trench is then planarized, resulting in a smooth top surface of the trench. A field oxide layer is then formed by LOCOS technology on a portion of the top surface of the trench and on the P well region proximate the trench. A gate electrode and a gate electrode line are formed by a mask pattern process after conducting material for the gate electrode and an insulating layer are sequentially formed on a portion of the P well region opposite the field oxide layer and on a portion of the field oxide layer. LDD regions are formed by an ion implantation process in the P well region near both sides of the gate electrode. An oxide film spacer is formed at each side of the gate electrode and at each side of the gate electrode line. A conductive layer is formed on the entire surface, except for a portion of the insulating layer formed on the gate electrode and the gate electrode line and execpt for a portion of the field oxide layer, thereby causing the charge storing electrode to be connected to the drain electrode to be formed later. The drain electrode and a source electrode are formed by diffusing the N+impurity contained in the conducting layer to the P well region with heat treatment. A first insulating layer is formed on the entire surface, and then removing a portion of the first insulating layer formed on the conducting layer on the source electrode by mask patterning process. A polycide layer for a bit line is formed on the first insulating layer and the conducting layer, where a portion of the first insulating layer has been removed, thereby connecting the source electrode to the polycide layer. A second insulating layer on the polycide layer for the bit line. A metal layer is formed on the second insulating layer and then a protective layer is formed on the second insulating layer and the metal layer.

This invention further relates to a method for manufacturing the DRAM of SDTSAC using a self-aligned contact process which comprising the steps of sequentially depositing a gate oxide film, a conducting material for gate electrode, an oxide film layer and a nitride film layer on the silicon substrate on which a P well region is formed. The conducting material for the gate electrode, the oxide film layer and the nitride film layer is then etched by a mask patterning process. A LDD region is then formed by ion implantation process after growing an oxide film at left and right sides of the conducting material for the gate electrode. Oxide film spacers are then formed by the anisotropic etching process after forming an oxide film at the left and right sides of the gate electrode. The nitride film is then removed. A conducting layer containing an impurity is deposited on the entire surface. Then a portion of the conducting layer which is deposited on the oxide film layer on the gate electrode is removed. The source electrode and the drain electrode are then formed by diffusing the impurity contained in the conducting layer into the P well region by heat treatment. A first insulating layer is formed on the entire surface, and then a portion of the first insulating layer formed on the conducting layer on the source electrode is removed. A polycide layer for bit line is then deposited on the first insulating layer and the conductive layer, where a portion of the first insulating layer has been removed, thereby connecting the source electrode to the polycide layer.

According to the DRAM cell technology of present invention, the following advantages are obtained:

First, an inside charge storage type structure for storing charges in the polysilicon filled trench, the trench walls having been coated by a capacitive oxide film, is utilized, the inside storage type structure can be applied to the DRAMs with more than 4M bit.

Second, since the present invention does not utilize the formation of a high concentration of an epitaxial layer on a silicon substrate, it is possible to fabricate CMOS which has a low power comsumption. This means that since the present invention utilizes a P well and N well region, there is no problem of diffusing the high concentration of the epitaxial layer toward the surface of the substrate, which occurs during the use of long periods of a high temperature as in prior art.

Third, in the conventional prior art SPT structure, in the formation of a N well region to protect the loss of effective capacitance as the depletion region of trench capacitor increases, a high energy ion implantation apparatus must be used. However, since the present invention does not require an underlying epitaxial layer, as in the prior art devices, the formation of the well region can be implemented by heat treatment and a low energy ion implanation apparatus without using the high energy ion implantation apparatus.

Fourth, according to the present invention, instead of using a high concentration of an epitaxial layer to prevent a loss of the effective capacitance, a high concentration of impurity region is formed by selectively diffusing a high concentration of impurity along the trench wall, whereby it serves as the conventional epitaxial layer having a high concentration.

Fifth, according to the present invention, in order to maximize the effective area of the trench capacitor in the same cell size, a trench can be formed under the field oxide layer.

Sixth, a soft error immunity which is a capability to protect the cell from stored charge dissipation caused by a cosmic α particle is improved relative to an outside charge storing method of the prior art, since a capacitive dielectric film is formed on the wall of the trench and an inside charge storing method for storing charge thereon is utilized.

Seventh, the total area resulting from a manufacturing tolerance necessarily required for a mask process which is used for connecting or forming each electrode of the trench capacitor and the MOSFET can be reduced greatly using the self-aligned contact process according to the present invention.

The novel feature of the present invention may be understood from the accompanying description when taken in conjunction with the accompanying drawings.

DETAILED DESCRIPTION

Figure 1:
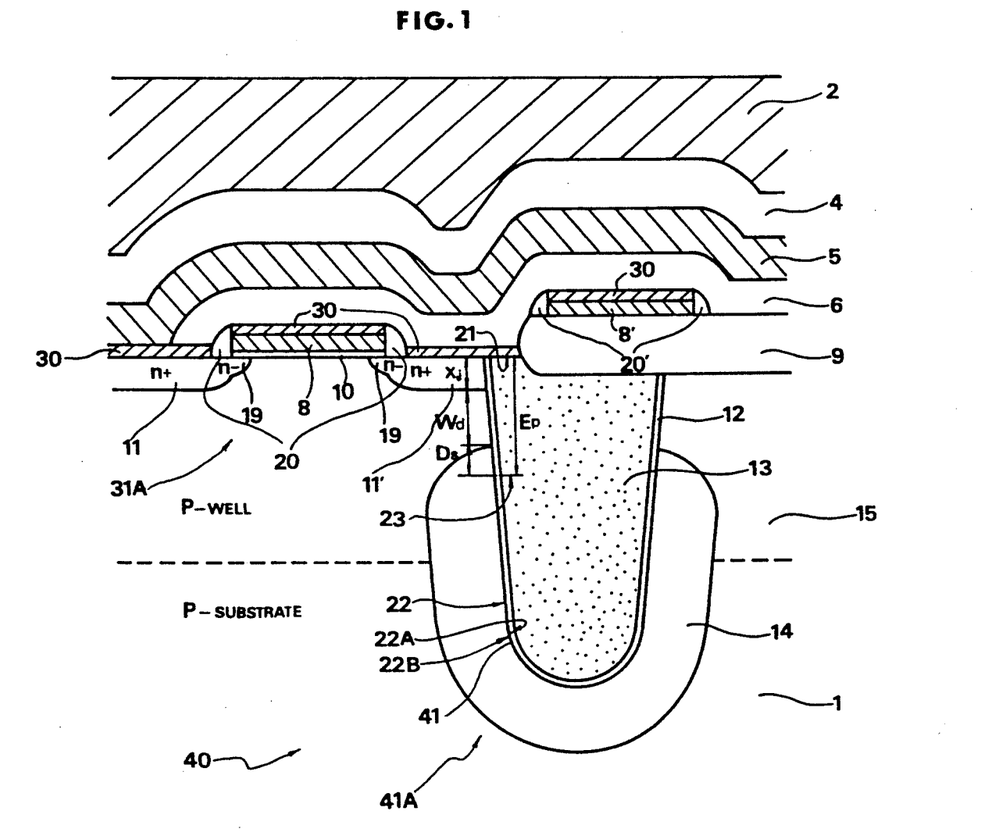
FIG. 1 illustrates a cross-section of a DRAM cell comprising a SDT (Side-wall Doped Trench Capacitor) cell and a MOSFET according to the first embodiment of the present invention.
Figure 5A:
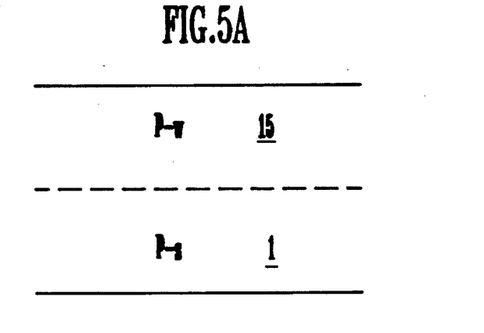
Figure 5B:
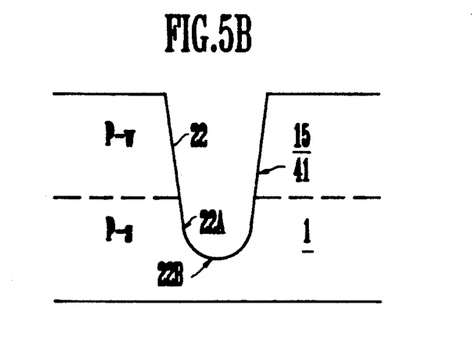
Figure 5C:
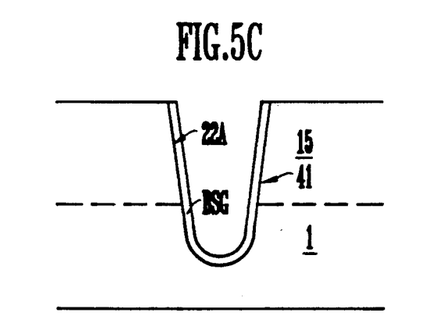
Figure 5D:
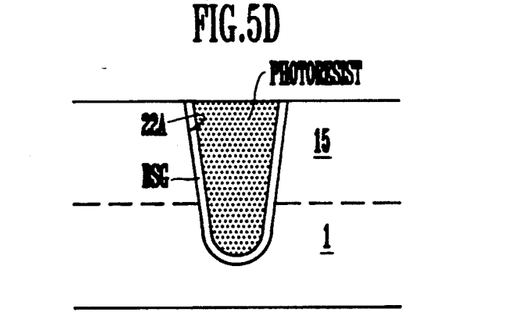
Figure 5E:
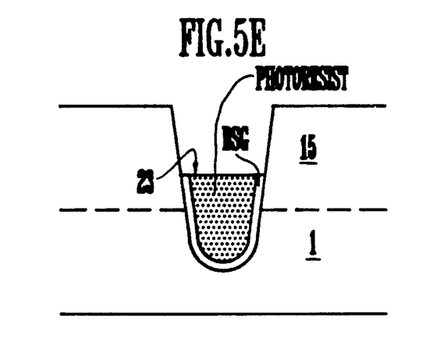
Figure 5F:
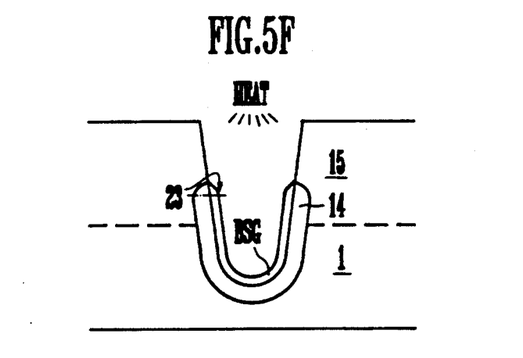
Figure 5G:
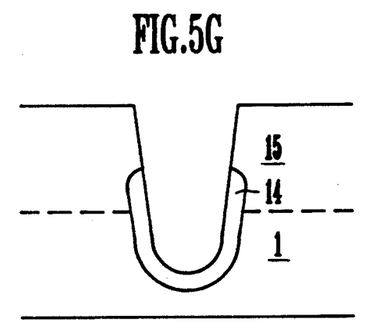
Figure 5H:
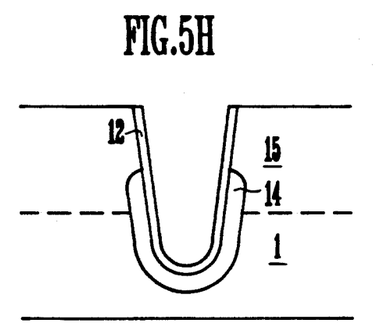
Figure 5I:
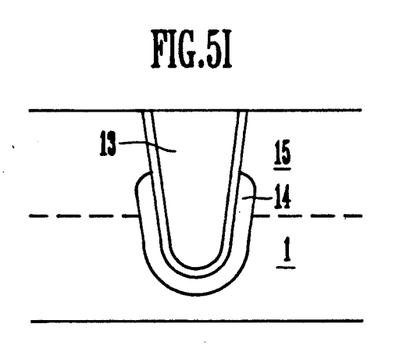
Figure 5J:
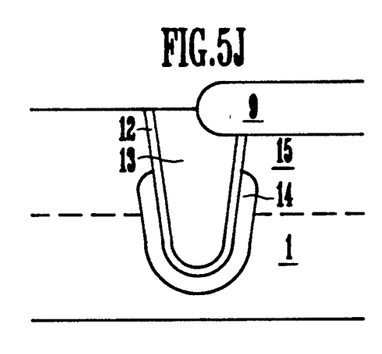

FIG. 1 illustrates a cross-section of a DRAM cell comprising a SDT cell 40 and a MOSFET 31A according to the first embodiment of the present invention. The manufacturing process for such a structure includes a number of initial sequential steps as seen in FIGS. 5A-5K inclusive, and comprises: First, a P well region 15 is formed on a P type silicon substrate 1(FIG. 5A). A trench 41 (FIG. 5B) is then formed from the top 21 of the P well region 15 into the P type silicon substrate 1 by the known RIE (Reactive Ion Etching) technology. A P+diffusion region 14 is formed by diffusion into the wall 22 of the trench 41 by a selective doping method using photoresist etch back technology. Even though the process for selectively forming the P+diffusion region 14 adjacent trench wall 22 of the trench 41 using the photoresist etch back technology is not shown in the drawings, the method will be described briefly. After a dopant source, such as BSG (Boro-Silica-Glass), is deposited on the inner surface 22A of the wall 22 of trench 41 to a desired thickness (FIG. 5C), the trench 41 is filled with a photoresist and planarized (FIG. 5D). In the usual practice, the trench 41 is overfilled with the excess photoresist being removed in order to provide a planarized surface. As will be described below, after removing the photoresist and BSG layers up to the etch back end point 23 (FIG. 5E), i.e., the point the P+diffusion region 14 is formed from the outer surface 22B of wall 22 of the trench 41, the remaining photoresist is removed from the trench 41 (FIG. 5E). By heat treatment (FIG. 5F) on the dopant source, such as BSG, which remains on the inner wall 22A of the trench 41, the P+diffusion region 14 is formed (FIG. 5G). Next, a capacitive dielectric film layer 12 (FIG. 5H), for example an ONO (Oxide-Nitride-Oxide) or an oxide film layer, is deposited on the inner surface 22A of wall 22 of trench 41. The outer surface 22B of wall 22 is in contact with the P+diffusion region 14. In order to form a charge storing electrode 13, the trench 41 is filled with N type doped polysilicon 24 and the top 21 of the trench 41 is planarized by the known technology, thereby forming a trench capacitor 41A (FIG. 5I). A field oxide layer 9 (FIG. 5J), which is an insulating layer, is formed in and on a portion of the top 21 of the trench 41, i.e., only partially covers the top 21 of the trench 41 as see FIG. 1, by the known LOCOS (Local Oxidation of Silicon) technology.

Figure 5K:
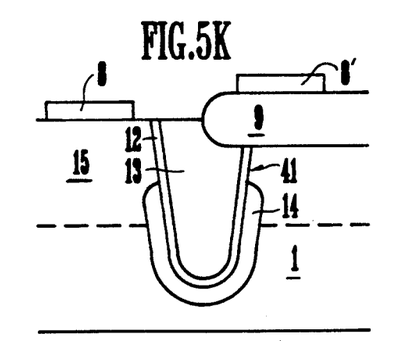

After this process, in order to form a N-MOSFET 31 on the P well region 15 in the substrate 1, a gate oxide film 10 is selectively formed on the P well region 15 and then conducting material for a gate electrode 8 (FIG. 5K) is deposited entirely over gate oxide film layer 10 and field oxide layer 9. Then, by a mask patterning process for the gate electrode, the gate electrode 8 and a gate electrode line 8' are formed on the gate oxide film 10 and the field oxide film 9, respectively. LDD regions 19 are formed by the ion implantation in the P+well at the both sides of the gate electrode 8. An oxide film layer is formed at both sides of the gate electrode 8 and the gate electrode line 8', and then oxidation film spacers 20 and 20' are formed by anisotropic etching at the both sides of the gate electrode 8 and the gate electrode line 8'. A source electrode 11 and a drain electrode 11' are formed in the P well region 15 by the ion implantation process. Next, after a conductor layer, for example titanium layer, is formed on each electrode 8, 8', 11 and 11', by a mask patterning process, then a silicide layer 30 as a conducting layer for the respective electrodes, is formed on each electrode 8, 8', 11 and 11' by heat treatment. The oxide film spacer 20, 20' and the field oxide film layer 9 are not covered by the silicide layer 30, as illustrated at FIG. 1.

As result of the process forming the silicide layer 30, the charge storing electrode 13 of trench capacitor 41A and the drain electrode 11' are electrically connected each other, thereby the resistance of the gate electrode 8 and gate electrode line 8' can be reduced as well as the resistance at the junction between drain electrode 11' and the charge storing electrode 13 can be reduced. After that, a LTO oxide film layer 6 (FIG. 1), which functions as a first insulating layer, is formed and then a portion of LTO oxide film layer 6 on the silicide layer 30 formed on the source electrode 11 is removed by a contact mask patterning process. Then, by forming a polyside layer 5, for bit line, on the LTO oxide film layer 6, the silicide layer 30 on the source electrode 11 at which a portion of the LTO oxide film layer 6 is removed, is connected to the polyside layer 5. A doped oxide film layer 4 is formed as a second insulating layer and a protective layer 2 is formed thereon. Here, the protective layer 2 protects the cell from heat, shock and current etc. The structure formed by the process according to the present invention is a DRAM cell comprising SDT cell 40.

Figure 2:
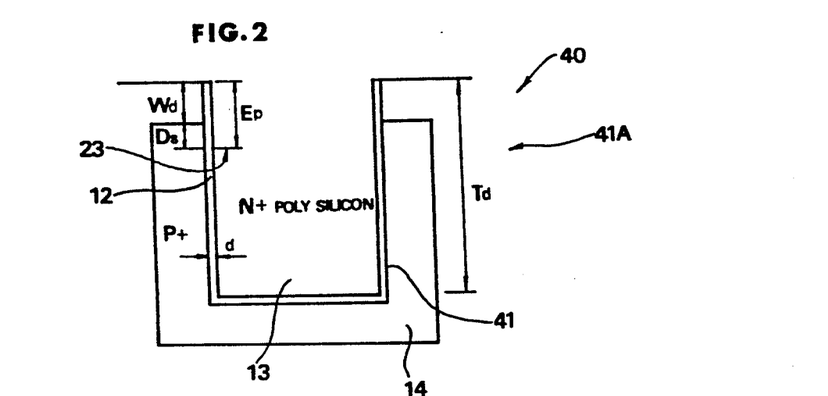
FIG. 2 illustrates a schematic trench structure used for calculating the capacitance of the trench capacitor of the SDT cell structure shown in FIG. 1.

FIG. 2 schematically illustrates the trench 41 taken from the FIG. 1, in which it is assumed that the structure of the trench capacitor 41A is U shaped to facilitate calculation of capacitance. Here, the dimension, stored voltage and surface concentration of the field region of the trench 41 illustrated in this invention are as follows:

The size of trench $41 = 1.4$ μm(micrometer)$\times 2.1$ μm

The thickness (d) of the capacitive dielectric film 12 of trench capacitor 41A, d = 180 Angstrom.
The voltage of storing electrode (13) = 5 Volts.
The voltage of silicon substrate (1) = −2 Volts.
The depth of trench (41), Td = 5 μm
The surface concentration of field oxide layer region (9) = 5 E 16 $Cm^{-3}$
The surface concentration of the P+diffusion region (14) = 2 E 19 $Cm^{-3}$
The concentration of N+polysilicon (13) = 1 E 20 $Cm^{-3}$ Accordingly, the capacitance, Cs, of the SDT cell 40 is, $$Cs = C1 + C2 + Cj \qquad (1)$$

Here, C1 is the capacitance of the region Wd without side-well doping.
C2 is the capacitance of the P+diffusion region 14 with side well doping.
Cj is the junction capacitance of at the drain electrode 11' of MOSFET.

However, when the voltage assumed above is applied, C1 and C2 are defined as efffective capacitance as follows:

$$1/C1 = 1/C1np + 1/C1ox + 1/C1d \qquad (2)$$

$$1/C2 = 1/C2np + 1/C2ox + 1/C2d \qquad (3)$$

Here, Cnp is a depletion capacitance at which a depletion is formed toward the N+doped polysilicon 13 when a voltage is applied, and Cox is the capacitance caused by the thickness "d" of the capacitive oxide and Cd is a depletion capacitance occurring toward the polysilicon substrate 1.

Combining the formulas, the following formula can be obtained. Here, Cj is negligible.

$$1/Cs = 1/Cnp + 1/Cox + 1/C1d + 1/C1d + C2d \qquad (4)$$

Here, $$\begin{aligned} Cnp &= C1np + C2np \\ Cox &= C1ox + C2ox \end{aligned} \qquad (5)$$

From the above formulas, Cnp, Cox, C1d and C2d are obtained.

$$Cnp = \frac{E_S \cdot E_0 \cdot A}{Xd^{A1x}} = 583 \, fF \qquad (6)$$

$$Cox = \frac{E_S \cdot E_0 \cdot A}{xd^{cx}} = 73 \, fF \qquad (7)$$

$$C1d = \frac{E_S \cdot E_0 \cdot A_1}{xd_1} = 4 \, fF \qquad (8)$$

$$C2d = \frac{E_S \cdot E_0 \cdot A_2}{xd_2} = 221 \, fF \qquad (9)$$

Accordingly, from the formulas (1) to (9), the storing capacitance, Cs is, $$Cs = 50 \, fF \qquad (10)$$

Thus, in the case where the junction capacitance of drain electrode 11' is negligible, the storing capacitance of the SDT 40 is approximately 50 fF.

Next, the process simulation for forming the SDT 40 structure will be described. In the SDT structure 40, the method for selectively doping a high concentration of boron on the outer surface 22B of wall 22 of trench 41 is most important. In order to explain optimum conditions for the process, the SUPREM 3 and SUPPR, which are a one dimensional simulator and a two dimensional simulator, respectively, have been performed to obtain the optimized conditions, for example, the determination of selective etch back end point 23 of BSG to be formed by the photoresist etch-back technology, the deposition of BSG film and drive-in process condition.

Considering a condition of a break-down voltage at the junction, as can be seen from the cross-section of SDT 40 shown in FIG. 1, since a reverse voltage is applied between the drain electrode 11' and the P+diffusion region 14 doped with a high concentration of boron on the side wall of trench 41, there is a possibility of occurrence of a break-down voltage therebetween. In other words, the condition causing the break-down in the P well region 15 is the condition when the value of electric field E at the depletion region reaches the Ecrit value. In this case, it is assumed that the junction is a planar junction. Accordingly, the Ecrit value can be obtained from the following formula.

$$E = Ecrit - \frac{4 \times 10^5}{1 - \frac{1}{3}\log(Na/1 \times 10^{16})} \quad (11)$$

Na is the concentration of the impurity in the P well region 15.

If the boron doped in the side wall of trench 41 is not diffused to the junction of drain electrode 11', the value of Na, which is the concentration of the P well region 15, will be 2 E 16 cm$^{-3}$ from the formula (11). So, the value of Ecrit will be $4.4 \times 10^5$ V/Cm. However, in the worst case that the boron doped in the side wall is diffused to the junction, the Na will be 1 E 18 Cm$^{-3}$. Then, Ecrit will be $1.2 \times 10^6$ V/Cm.

When the Na is 2 E 16 Cm$^{-3}$ and 1 E 18 Cm$^{-3}$ respectively, the minimum width of the depletions should be 0.32 $\mu$m and 0.1 $\mu$m respectively in order to maintain the break-down voltage over 14 V, i.e. in order to maintain that voltage over the break-down voltage at the junction. Accordingly, when Na is 2 E 16 Cm$^{-3}$, in order to maintain over 14 V the break-down voltage at the junction of p+diffusion region 4 of the side wall of trench and the drain electrode 11', it is necessary to keep the width of depletion Wd over 0.4 $\mu$m.

$$Wd = 0.4 \ \mu m \quad (12)$$

Next, a depth Xj of the junction of drain electrode 11' will be considered.

In the case that the known silicide treatment is used for the source electrode 11 and drain electrode 11' in the MOSFET 31A, when the silicide layer 30 is formed, the silicon is reacted with titanium, thereby the area of silicon is collapsed depending upon their volume ratio. This results in a shallower junction depth which reduces the break-down voltage at the junction of the source and the drain. Since the prior art junction of the source and drain formed by arsenic 11, a formation of a graded junction with arsenic and phosphor is formed in manner that Xj, the depth of junction, is as follows:

$$Xj = 0.35 \ \mu m \quad (13)$$

On the other problems of process of P+diffusion will be considered. In checking, using the SUPREM 3 and SUPRA simulation, the optimum concentration of boron of BSG film, the drive-in condition, and distribution of boron impurity doped in the side wall of the trench, the determination of optimum value for distribution of boron impurity should satisfy two conditions. First, the concentration of boron near the interface of the side wall of trench should be 2 E 19 Cm$^{-3}$ in order to increase the effective capacitance. Second, the minimum diffusion of boron into the P well region 15 should occur from the etch-back end point.

The two conditions mentioned above are determined by the concentration of BORON involved in the BSG film depositing process, and the temperature and time of drive-in treatment. As result of the simulations, the optimum conditions are as follows:

In the BSG film depositing process, the content of boron is from 1 E 21 Cm$^{-3}$ to 5 E 21 Cm$^{-3}$ and if the content is too low, it results in reduction of the effective capacitance. If the content is too high, the finally diffused distance will become too great after the drive-in process, thereby deteriorating the break-down property at the junction. Also, the drive-in condition for the BSG film takes about 30 minutes at 920 to 950 degrees Centigrade.

Under these conditions, the actually diffused distance "Ds" of the P+diffusion region 14 at side wall 22 of the simulated trench is approximately 0.8 to 1.1 $\mu$m in upper direction from the top of the etch-back end point of the BSG film. Here, the diffused distance in upper direction can be reduced more by using the P well region.

For example, in order to control the concentration of boron during the drive-in treatment, the optimum parameters of a sample wafer are set such that the sheet resistance is about 13 to 250 $\Omega/\square$ and the depth of junction is 0.2 to 0.3 $\mu$m.

Accordingly, from the above description, the etch-back end point value, Ep, of the BSG film required for selective doping of the side wall of the trench, by the photoresist etch-back technology during the actual process, can be determined.

The value of the etch back end point, Ep=Xj+Wd+Ds. where: Xj is the depth of junction of drain electrode 11'. Wd is the width of depletion in order to obtain the break-down over 14 Volts. Ds is the diffused distance in the side wall in upper direction from the etch-back point, which is determined depending upon the process conditions.

As obtained above, the optimum etch-back end point value, Ep is 0.35+0.4+(0.8 to 1.1), i.e. 1.5 to 1.8 $\mu$m.

It should be noted that the values set forth above have been determined on the basis of the results of experimental calculation and simulation in order to explain the gist of present invention.

The DRAM cell comprising the SDT 40 and MOSFET 31A according to the present invention is subjected to the contact mask patterning process to connect the source electrode 11 of MOSFET 31A and the electrode for bit line or to connect the drain electrode 11' to the charge storing electrode 13 of trench 41. In case of implementing the contact mask alignment process to form the gate electrode 8, to connect the source electrode 11 of MOSFET 31A and the electrode for bit line, and to connect the drain electrode 11' and the charge storing electrode 13, since a mismatch of mask alignment occurs due to a precision limit of apparatus used for the manufacturing process, the patterning process is implemented with a minimum tolerance, thereby a leak current at the connection with the gate electrode is prevented. Accordingly, the process should be implemented in a manner that the distance between the side of gate electrode 8 and contact mask has a minimum extra distance. Thus the DRAM cell manufactured according to the first embodiment of the present invention requires more space so that the structure of cell should be improved to be used for 16 or more megabit of large scale integrated memory devices.

Figure 3:
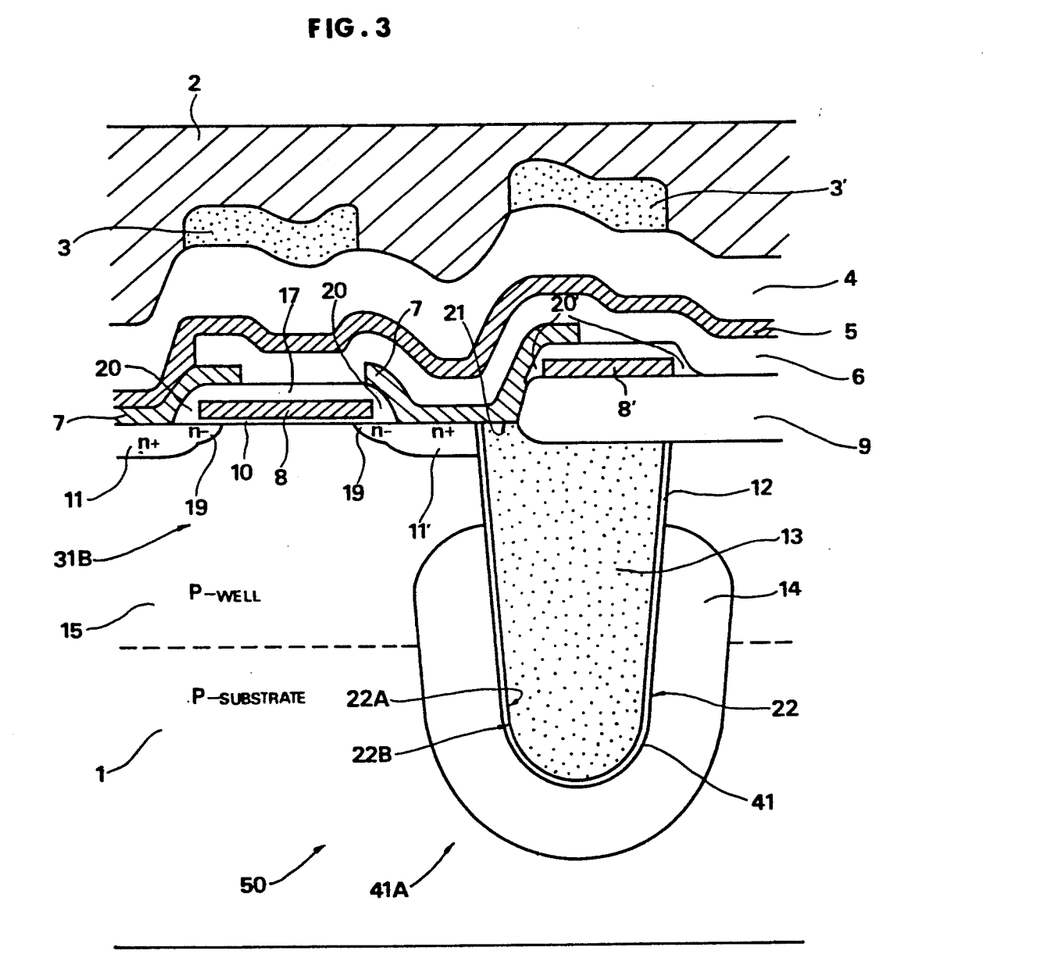
FIG. 3 illustrates a cross-section of a DRAM cell of SDTSAC cell comprising the SDT and MOSFET formed by the self-aligned contact process, according to the second embodiment of the present invention.

The improved structure is shown in FIG. 3 which is the second embodiment of the present invention and it will be described in detail in reference to the FIG. 3 illustrates a cross-section of a DRAM cell of SDTSAC cell 50 structure comprising a SDT cell and a MOSFET 31B which is formed by a self-aligned contact technology according to the second embodiment of present invention. After forming the P well region 15 on the P type silicon substrate 1, a mask pattern layer is formed on the P well region 15 for forming a trench capacitor 41A and then the trench 41 is formed by the RIE etching technology and extends from the top of the P well region into a portion of the P type silicon substrate 1. As shown in FIG. 1, the P+diffusion region 14 for an external electrode is formed on the wall 22 of trench 41 by the selective side wall doping method using the photoresist etch-back technology as described above.

After the formation of the P+diffusion region, a capacitive dielectric film layer 12, for example an ONO layer or an oxide film, is deposited on inner surface 22A of wall 22 of trench 41, and at the outer surface 22B thereof, the P+diffusion region 14 is formed. In order to form the charge storing electrode 13, the trench 41 is filled with N type doped polysilicon 24 and the top 21 of the trench 41 is planarized by known technology. A field oxide layer 9 which is an insulating layer is formed by known LOCOS (Local Oxidation of Silicon) technology on a portion of the top 21 of the leveled trench 41.

Next, after the gate oxide film 10 is deposited in order to form the N type MOSFET on the P well region 15 in the silicon substrate 1, the conducting material for the gate electrode 8 and the LTO oxide film layer (17) are subsequently deposited thereon. Then, by a mask patterning process for the gate electrode, the gate electrode 8 and the gate electrode line 8' are formed respectively. On the other hand, the LDD region 19 is formed by the ion implantation at the P well region 15 near the both sides of gate electrode 8. An oxide film layer is formed at the both sides of the gate electrode 8 and the gate electrode line 8' and then the oxide film spacer 20 and 20' are formed by anisotropic etching.

Then, an IPOLY layer 7 is deposited and then a portion thereof on the gate electrode 8 and gate electrode line 8' is removed. By heat treatment, the N+impurity contained in the IPOLY layer 7 can be diffused into the P well region 15 so that the source electrode 11 and the drain electrodes 11' are formed. A LTO oxide film layer 6, which functions as a first insulating layer, is deposited and removed leaving the portion as shown in FIG. 3 and it is connected to the IPOLY layer 7 on the source electrode 11 by depositing a polycide layer 5. By depositing a oxide film layer 4, which functions as a second insulating layer, doped with BSG on the polycide layer 5 for the bit line, the insulation between metal oxide 3 and 3', and the polycide layer 5 for the bit line is obtained.

In case of continuously connecting the gate electrode 8 and the gate electrode line 8' which become a word line, a resistance is increased so that a processing speed is delayed. Accordingly, by forming the metal layer 3 and 3' for the word line on the doped oxide layer 4 and contacting the metal layer 3 and 3' to the gate electrode 8 and the gate electrode line 8' every 128th cell, the delay of speed can be avoided. The protective layer 2 is then formed so that the DRAM cell finally manufactured can be protected from heat, shock and current. The structure manufactured by the process described above is the DRAM cell of the SDTSAC cell 50 structure according to the present invention.

Referring to FIG. 3, the structure forming the gate electrode 8 on the gate oxide film 10 which is on the P well region 15, and the structure connecting the source electrode 11 and the drain electrode 11' of the MOSFET 31B to the bit line electrode and the charge storing electrode 13, is formed by the self-aligned contact method which comprises one of the main embodiments of present invention. The method will be described in detail in reference to FIGS. 4A–4E.

Figure 4A:
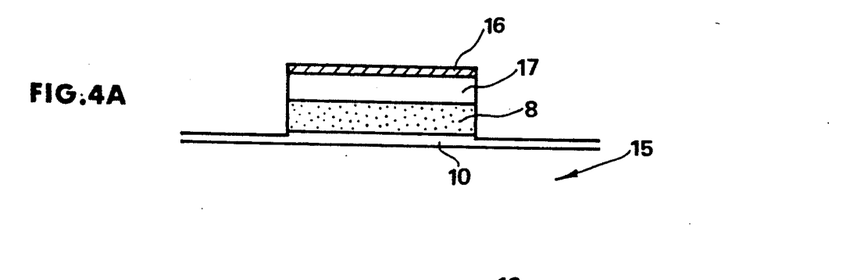
FIG. 4A illustrates a cross-section of the structure in which a gate electrode is formed during the self-aligned contact process.

FIGS. 4A–4E illustrate a cross-section of a N type MOSFET structure which is located on the P well 15 near the trench capacitor. FIG. 4A shows a step in which a gate oxide film 10 and a conducting material for the gate electrode 8 are sequentially deposited. Then a LTO oxide film 17 is deposited thereon. Next, in order to protect the LTO oxide film when etching is performed and to prevent the oxide from growing in upper direction during oxidation process, a nitride film layer 16 is deposited on the LTO oxide film layer 17. Then only a portion of the structure described above is formed by mask patterning process.

Figure 4B:
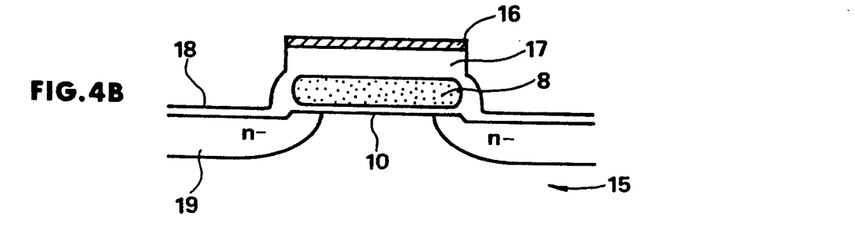
FIG. 4B illustrates a cross-section of the structure in which a oxide film is formed on the left and the right sides of gate electrode of FIG. 4A, and the silicon wafer, with the LDD regions formed in the P well region.

FIG. 4B illustrates the structure of a partially completed MOSFET having an oxide film layer 18 deposited on left and right of the gate electrode 8 and on the P well 15 in order to prevent a current leak which may occur between the IPOLY layer 7 and the gate electrode 8 at left and right side of the gate electrode 8, and to make the depth of junction of N-impurity shallow. The LDD region 19 is formed by implanting N-impurity. Here, in order to prevent electrons from accelerating by the strong electric field occurring when an inverse conductive layer is produced at the source electrode 11 and the drain electrode 11' which are to be formed later, a low concentration of N-region, that is LDD region 19, is formed at a portion of the drain and the source, which are located near the gate electrode, thereby the strength of electric field is reduced so that it possible to prevent the electrons from accelerating.

Figure 4C:
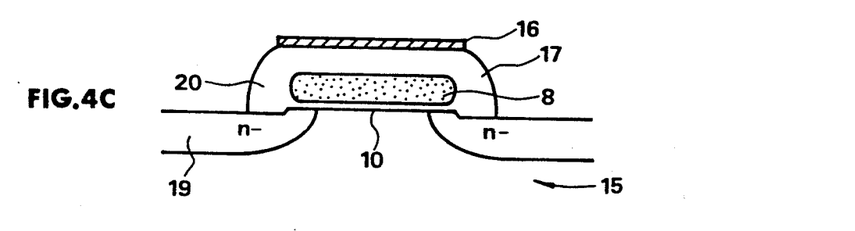
FIG. 4C illustrates a cross-section of the structure in which spacers are formed at left and right sides of the gate electrode shown in FIG. 4B.

FIG. 4C illustrates a cross-section view of a partially conpleted MOSFET in which, after the oxide film layer 18 is formed at both sides of the gate electrode 8, a oxide film spacer 20 is formed by the anisotropic etching. When heat treatment of IPOLY layer 7 to be formed later is performed, the oxide film spacer 20 prevents an N+impurity from diffusing into the LDD region 19 which is located under the gate electrode 8.

Figure 4D:
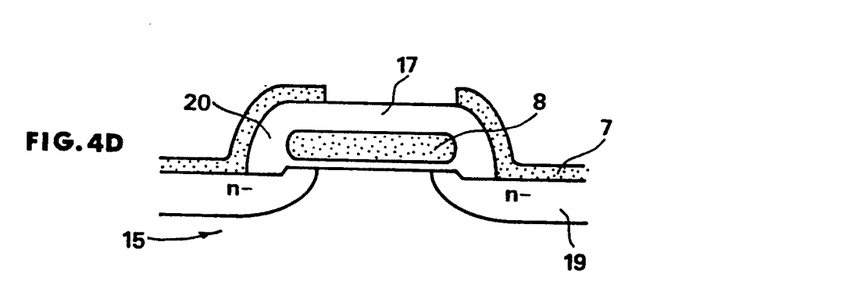
FIG. 4D illustrates a cross-section of the structure in which an IPOLY pattern is formed on the spacer positioned at the left and right sides of gate electrode.

FIG. 4D illustrates the structure of a partially completed MOSFET in which, after the nitride film layer 16 on the gate electrode 8 is removed, the IPOLY layer 7 is deposited on the LTO layer 17 which is located on the gate electrode 8, and on the LDD region 19. Then, a portion of the IPOLY layer 7 on the gate electrode 8 is removed. At this moment, since there is no need to perform additional mask process when the IPOLY layer 7 is deposited, a tolerance required for the mismatch of mask alignment occurring when the mask patterning process is performed as described in opening paragraph does not have to be considered.

Referring to FIG. 3, it is assumed that the distance between the IPOLY layer 7 and the left and right side of gate electrode 8 are each X, the distance between the right side of gate electrode line 8' and the IPOLY layer 7 is X, and the width of unit cell, which is toward the word line, is Y. Then, the area which can be reduced according the present invention is 3xXxY.

Figure 4E:
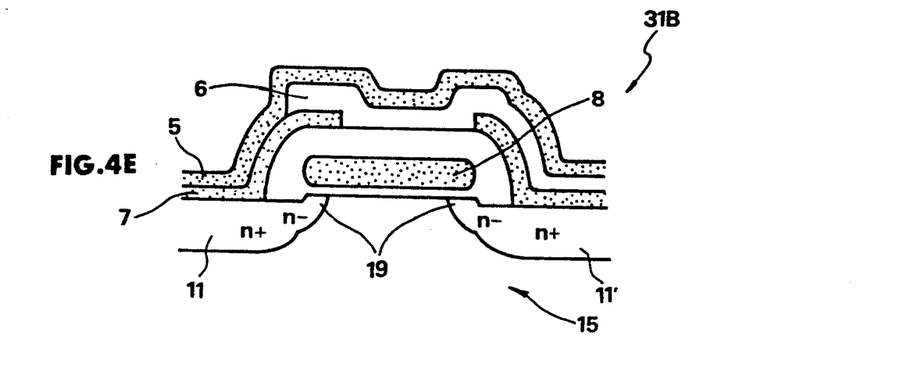
FIG. 4E illustrates a cross-section of structure in which a drain and a source electrode are formed by a known drive-in process after the process used to prepare the structure shown in FIG. 4D, and a LTO (Low Temperature Oxidation) film formed on the gate electrode with a pattern formed on the IPOLY layer, and, FIGS. 5A through 5K inclusive illustrate in diagrammatic form a number of the sequential steps in manufacturing the cell.

FIG. 4E illustrates a cross-section of MOSFET 31B structure in which a source 11 and a drain 11' are formed by heat treatment of the IPOLY layer 7 shown in FIG. 4D by diffusing the impurity contained in the IPOLY layer 7 into P well region 15. In order to insulate the IPOY layer 7 on the gate electrode 8 from the polycide layer 5 for bit line, a LTO layer 6 is deposited and then a portion thereof is removed leaving a predetermined portion as shown. Next, a polycide layer 5 is deposited on entire surface of the MOSFET structure.

As described above, in the second embodiment of the present invention, the process for depositing the IPOLY layer 7 after formation of the gate electrode 8, the process for forming the source 11 and the drain electrode 11', and the process for depositing the polycide layer 5 for bit line after deposition of the LTO layer are performed by the self-aligned contact process.

The cell structure manufactured according to the second embodiment of the present invention can be operable as unit DRAM cell in which a MOSFET and a trench capacitor are connected in series. That is, the gate electrode, source electrode and drain electrode of the MOSFET are connected to the word line, bit line and the charge storing electrode of trench capacitor respectively, and the other terminal of the trench capacitor is connected to the P+substrate, so that the DRAM cell which may operate storage and clear operation can be obtained.

The area of RAM cell of SDTSAC cell 50 structure according to the second embodiment of the present invention can be reduced effectively in comparison with that of the DRAM cell of SDT cell structure according to the first embodiment of present invention. For example, the length, the product of 3X in bit line direction which is a minimum tolerance required for the DRAM cell of SDT cell structure during the contact mask process and the length, Y which is the width in word line direction, i.e., all area 3xXxY can be reduced.

In the DRAM cell of SDT cell 40 structure of the first embodiment of the present invention which does not employ the self-aligned mask contact process, since the tolerance of X and Y equals 0.5 μm and 2.8 μm, respectively, the area which can be reduced in the DRAM cell of SDTSAC cell 50 structure according to the second embodiment of present invention is $3XY = 3 \times 0.5 \mu m \times 2.8 \mu m = 4.2 \mu m$. Accordingly, in the case that the SDTSAC cell 50 structure is applied to a semiconductor storage device having more than a megabit, 4.2 μm per unit cell will be reduced so that it's effect is so great.

While the invention has been described with respect to the preferred embodiments of the process using a N MOSFET after forming a P well region 15 on a P type substrate 1, as appreciated by one skilled in the art, it should be noted that the same process can be applied to form a N well in a P type silicon substrate, on which a P MOSFET is formed, with the trench filled with a P-type doped impurity.

The forgoing description of the preferred embodiments has been presented for the purpose of illustration and description. It is not intended to limit the scope of this invention. Many modifications and variation are possible in the light of above teaching. It is intended that the scope of the invention be defined by the claims.

What is claimed is:

1. A method for manufacturing a DRAM of SDT cell structure comprising:

forming a P well region on a t type silicon substrate;

forming a trench from the top of the P well region into a portion of the P type substrate with the trench having an inner surface;

forming a selectively doped P+diffusion region into a portion of the P well region and in a portion of the P type silicon substrate by;

(a) depositing an impurity dopant source of the inner surface of the trench;

(b) filling the trench with a photoresist, and selectively etching back the photoresist;

(c) removing the portion of the impurity dopant exposed by the selective etching of the photoresist;

(d) removing all the remaining photoresist; and, (e) forming the selective P+diffusion region in the said portions of the P well region and said P type substrate by heat treatment of the remaining impurity dopant source;

removing the remaining impurity dopant source from the trench;

forming a capacitive dielectric film layer on the inner surface of the trench;

filling the trench with material for a charge storing electrode, and planarizing the resulting top surface of the trench;

forming a field oxide layer by LOCOS technology on a portion of the top surface of the trench and on the P well region proximate the trench;

forming a gate electrode by a mask pattern process on a portion of the P well region opposite the field oxide layer and forming a gate electrode line by the mask pattern process on a portion of the field oxide layer;

forming LDD regions by an ion implantation process in the P well region near both sides of the gate electrode;

forming an oxide film spacer at each side of the gate electrode and at each side of the gate electrode line;

forming a source electrode and a drain electrode in the P well region by the ion implantation process such that a portion of the source and a portion of the drain electrode is located under the gate electrode;

forming a conducting layer on the entire surface except for a portion of the field oxide layer and the oxide film spacers formed at each side of the gate electrode and the gate electrode line, thereby connecting the drain electrode and the charge storing electrode;

forming a first insulating layer on the entire surface after the drain electrode and the source electrode are connected;

removing a portion of the first insulating layer, by the mask patterning process, from the conducting layer which is formed over a portion of the source electrode;

forming a polycide layer for a bit line on the first insulating layer and the conducting layer, where a portion of the first insulating layer has been removed, thereby connecting the source electrode to the polycide layer; and;

sequentially forming a second insulating layer and a protective layer on the polycide layer for the bit line.

2. A method for manufacturing a DRAM of SDTASC cell structure comprising:

forming a P well region on a P tyle silicon substrate;

forming a trench from the top of the P well region into a portion of the P type substrate with the trench having an inner surface;

forming a selectively doped P+diffusion region the trench into a portion of the P well region and in a portion of the P type silicon substrate by depositing an impurity dopant source on the inner surface of the trench;

filling the trench with a photoresist, and selectively etching back the photoresist;

removing the portion of the impurity dopant exposed by the selectively etching of the photoresist;

removing all of the remaining photoresist;

forming the selective P+diffusion region in said portion of the P well region and said P type substrate by heat treatment of remaining impurity dopant source;

removing the remaining impurity dopant source from the trench;

forming a capacitive dielectric film layer on the inner surface of the trench;

filling the trench will material for a charge storing electrode, and planarizing the resulting top surface of the trench;

forming a field oxide layer by LOCOS technology on a portion of the top surface of the trench and on the P well region proximate the trench;

forming a gate electrode and a gate electrode line by a mask pattern process after a conducting material for the gate electrode and an insulating layer are sequentially formed on a portion of the P well region opposite the field oxide layer and on a portion of the field oxide layer;

forming LDD regions by an ion implantation process in the P well region near both sides of the gate electrode;

forming an oxide film spacer at each side of the gate electrode and at each side of the gate electrode line;

forming a conducting layer on the entire surface except for a portion of the field oxide layer and the oxide film spacers formed at each side of the gate electrode and the gate electrode line, thereby causing the charge storing electrode to be connected to a drain electrode to be formed later;

forming a source electrode and a drain electrode by diffusing the N+ impurity container in the conducting layer to the P well region with heat treatment;

forming a first insulating layer on the entire surface, and removing a portion of the first insulating layer formed on the conducting layer which is formed over a portion of the source electrode by a mask patterning process;

forming a polycide layer for a bit line on the first insulating layer and the conducting layer, where a portion of the first insulating has been removed, thereby connecting the source electrode to the polycide layer;

forming a second insulating layer on the polycide layer for the bit line; and forming a metal layer on the second insulating layer and then forming a protective layer on the second insulating layer and the metal layer.

3. A method for manufacturing the DRAM of SDTSAC claimed in claim 2 using a self-aligned contact process, the self-aligned contact process comprising the steps of;

sequentially depositing a gate oxide film, a conducting material for gate electrode, an oxide film layer and a nitride film layer on the silicon substrate on which a P well region is formed;

etching the conducting material for gate electrode, the oxide film layer and the nitride film layer by a mask patterning process;

forming a LDD region by ion implantation process after growing an oxide film at left and right sides of the conducting material for the gate electrode;

forming oxide film spacers by anisotropic etching process after forming an oxide film at the left and right sides of the gate electrode, and removing the nitride film;

depositing a conducting layer containing an impurity on the entire surface, and removing a portion of the conducting layer deposited on the oxide film layer on the gate electrode;

forming the source electrode and the drain electrode by diffusing the impurity contained in the conducting layer into the P well region by heat treatment;

forming a first insulating layer on the entire surface, and removing a portion of the first insulating layer formed on the conducting layer on the source electrode;

depositing a polycide layer for bit line on the first insulating layer and the conductive layer, where a portion of the first insulating layer has been removed, thereby connecting the source electrode to the polycide layer.

* * * * *